US006387722B1

(12) United States Patent
Motoki et al.

(10) Patent No.: US 6,387,722 B1
(45) Date of Patent: May 14, 2002

(54) METHODS FOR PREPARING AN EPITAXIAL WAFER HAVING A GALLIUM NITRIDE EPITAXIAL LAYER DEPOSITED ON A SEMICONDUCTOR SUBSTRATE

(75) Inventors: Kensaku Motoki; Masato Matsushima; Katsushi Akita; Mitsuru Shimazu; Kikurou Takemoto, all of Hyogo; Hisashi Seki; Akinori Koukitu, both of Tokyo, all of (JP)

(73) Assignee: Sumitomo Electric Industries, LTD, Osaka (JP)

( * ) Notice: Subject to any disclaimer, the term of this patent is extended or adjusted under 35 U.S.C. 154(b) by 0 days.

(21) Appl. No.: 09/578,704

(22) Filed: May 26, 2000

Related U.S. Application Data

(62) Division of application No. 09/041,109, filed on Mar. 12, 1998, now Pat. No. 6,270,587.

(30) Foreign Application Priority Data

Mar. 14, 1997 (JP) ............................................. 9-82319
Mar. 11, 1998 (JP) ............................................ 10-78333

(51) Int. Cl.[7] ............................................. H01L 21/00
(52) U.S. Cl. ....................................................... 438/46
(58) Field of Search ........................... 438/46, 47, 493, 438/503, 504, 509; 117/952, 9, 89; 148/33, 33.4, 33.5

(56) References Cited

U.S. PATENT DOCUMENTS 5,290,393 A * 3/1994 Nakamura .................. 438/509

OTHER PUBLICATIONS

Journal of Electronic Materials, vol. 24, No. 4, 1995, Epitaxial Growth of Cubic GaN on (111) GaAs by Mtetalorganic Chemical Vapor Deposition, Hong et al., pp. 213–218.
Journal of Crystal Growth 164 (1996), Observation of MBE–Grown Cubic–GaN/GaAs and Cubi–GaN/3C–SiC Interfaces By High Resolution Transmission Electron Microscope, Okumura eta l., pp. 213–218.
Appl. Phys. Let. 59 (9), Aug. 26, 1991, Epitaxial Growth of Cubic and Hexagonal GaN on GaAs by Gas–Source Molecular–Beam Epitaxy, pp. 1058–1060, H. Kumura et al.
Journal of Crystal Growth 145, (1994), GaAs Vertical and Lateral Growth Enhancerment Using Trimethylgallium and Trimethylarsenic in Selective Area Metalorganic Vapor Phase Epitaxy on a (111) B Substrate, pp. 297–301, LeBellego et al.
Japan J. Apply. Phys. vol. 33, (1994), Part 1, No. 12A, Dec. 1994, Comparision of Hydride Vapor Phase Epitaxy of GaN Layers on Cubic GaN/ (100) GaAs and Hexagonal GaN (111) GaAs Substrates, Tsuchiya et al., pp. 6448–6453.
Journal of Crystal Growth 164, (1996), The Investigation of GaN Growth on Silicon and Sapphire Using In–Situ Time–Of–Flight Low Energy Ion Scattering and RHEED, Taferner et al., pp. 167–174.

(List continued on next page.)

*Primary Examiner*—Keith Christianson
(74) *Attorney, Agent, or Firm*—Smith, Gambrell & Russell, LLP

(57) ABSTRACT

The present invention provides an epitaxial wafer comprising a (111) substrate of a semiconductor having cubic crystal structure, a first GaN layer having a thickness of 60 nanometers or more, a second GaN layer having a thickness of 0.1 $\mu$m or more and a method for preparing it.

11 Claims, 5 Drawing Sheets

OTHER PUBLICATIONS

J. Vac. Sci. Technology B 14(3), May/Jun. 1996, Taferner et al., Investigation of GaN Deposition of Si, $Al_2O_3$, and GaAs Using In Situ Mass Spectroscopy of Recoiled Ions and Reflection High–Energy Electron Diffraction, pp. 2357–2361.

Japan J. Appl. Phys. vol. 35 (1996), Part 2, No. 6B, Jun. 15, 1996, Tsuchiya et al., Layer–by–Layer Growth of GaN on GaAs Substrates by Alternate Supply of GaCI, and NH, pp. L748–L750.

J. Mater. Res. vol. 8, No. 10, Oct. 1993, Ross et al., Single Crystal Wurzite GaN on (111) GaAs with A1N Buffer Layers Grown by Reactive Magnetron Sputter Deposition, pp. 2613–2616.

Appl. Phys. Lett. vol. 67, No. 25, Dec. 18, 1995, Yang et al., Temperature–Mediated Phase Selection During Growth of GaN on (111) A and (111) B GaAs Substrates, pp. 3759–3761.

Journal of Crystal Growth 164, (1996), The Nitridation of GaAs and GaN Deposition on GaAa Examined by In–Situ Time–Of Flight Low Energy Ion Scattering and RHEED, Bensaoula et al., pp. 185–189.

* cited by examiner

METHODS FOR PREPARING AN EPITAXIAL WAFER HAVING A GALLIUM NITRIDE EPITAXIAL LAYER DEPOSITED ON A SEMICONDUCTOR SUBSTRATE

This application is a division of application Ser. No. 09/041,109, filed on Mar. 12, 1998 now U.S. Pat. No. 6,270,587. This related application is relied on and incorporated herein by reference in its entirety.

BACKGROUND OF THE INVENTION

1. Field of the Invention

The present invention relates to an epitaxial wafer having a gallium nitride (GaN) epitaxial layer deposited on a semiconductor substrate and the method for preparing the epitaxial wafer, which is used for blue and green optoelectronic devices.

2. Description of Related Art

Referring to FIG. 1, a conventional gallium nitride blue light emitting device will be explained. FIG. 1 shows a sectional view of a conventional GaN blue light emitting device. The GaN blue light emitting device comprises an epitaxial wafer including a sapphire substrate 1, a GaN buffer layer 2 deposited on the sapphire substrate 1, and a hexagonal GaN epitaxial layer 3, a first cladding layer 4, a luminescence layer 5, a second cladding layer 6 and a GaN epitaxial layer 7 stacked in the named order on the epitaxial wafer. Ohmic electrodes 8 and 9 are respectively arranged on the GaN epitaxial layers 3 and 7. The GaN buffer layer 2 is disposed to relax distortion caused by difference in lattice parameters between the sapphire substrate 1 and GaN epitaxial layer 3.

Since the conventional light emitting device shown in FIG. 1 uses an insulating sapphire substrate 1, necessary two ohmic electrodes 8 and 9 should be formed at the same side of the substrate 1. This requires at least two times of patterning process by using photolithography. It is also necessary to etch nitride by reactive ion etching, which complicates the manufacturing process of the device. In addition, sapphire has high hardness which make it difficult to divide the devices into individual ones.

In the prior art, it has been tried to use a conductive gallium arsenic (GaAs) substrate instead of the sapphire substrate. For example, Okumura et al. grew cubic GaN on a (100) plane of a GaAs substrate (Journal of Crystal Growth, 164 (1996), pp. 149–153). However, cubic GaN grown on a (100) plane of a GaAs substrate generally has poor quality due to large amount of stacking fault, as shown in a transmission electron microscopy photograph of Okumura et al. This is considered to be caused by instability of cubic GaN which is of higher degree than hexagonal GaN.

On the other hand, it has been also tried to grow more stable hexagonal GaN on a (111) plane of a GaAs substrate. C. H. HONG et al. reported that hexagonal GaN was grown on a (111) A-plane and a (111) B-plane of GaAs substrate by metalorganic vapor phase epitaxy (MOVPE) (Journal of Electronic Materials, Vol. 24, No. 4, 1995, pp. 213–218). However, the grown hexagonal GaN had insufficient properties for use of a blue light emitting device. This is due to low growth temperatures of 800° C. at the highest of the GaN epitaxial layer of C. H. HONG et al., contrary to the GaN layer of the blue light emitting device fabricated on a sapphire substrate grown by MOVPE at the growth temperature of higher than 1000° C. C. H. HONG et al. grew the GaN epitaxial layer at a low temperature since arsenic having a high vapor pressure would escape from GaAs substrate at a temperature of around 600° C.

As mentioned above, in prior art, when hexagonal GaN is epitaxially grown on a GaAs (111) substrate, the substrate temperature is raised to 850° C. or so in order to prevent damage of the GaAs substrate caused by heating. By this, the hexagonal GaN epitaxial film obtained by the conventional MOVPE has carrier density of as high as $1\times10^{19}$ cm$^{-3}$ at non-dope, which is not suitable for a blue light emitting device.

SUMMARY OF THE INVENTION

Accordingly, it is an object of the present invention to provide a GaN epitaxial wafer having sufficient electronic properties for a blue light emitting device and formed on a GaAs semiconductor substrate and method for preparing the GaN epitaxial wafer, which have overcome the above mentioned defect of the conventional one.

The above and other objects of the present invention are achieved in accordance with the present invention by an epitaxial wafer comprising a (111) substrate of a semiconductor having cubic crystal structure, a first GaN layer having a thickness of 60 nanometers or more, a second GaN layer having a thickness of 0.1 $\mu$m or more. The first GaN layer preferably has a thickness of 200 nanometers or less and the second GaN layer has a thickness of 5 $\mu$m or less.

According to the invention, the cubic semiconductor (111) substrate is preferably a GaAs (111) substrate. The GaAs (111) A-plane substrate has an advantage that arsenic is less prone to escape and the GaAs (111) B-plane substrate has an advantage that its surface can easily finished by polishing.

According to another aspect of the invention, there is provided a method for preparing an epitaxial wafer comprising the steps of:

supplying a first mixture of material gases comprising a metalorganic including Ga and hydrogen chloride (HCl) and a second mixture of material gases comprising ammonia (NH$_3$) into a chamber heated by a heat source disposed outside of the chamber;

growing a buffer layer by vapor deposition on a substrate at a first temperature disposed in the chamber;

improving crystallinity of the buffer layer by increasing substrate temperature from the first temperature; and supplying the first and second mixtures of material gases into the chamber in which the substrate is heated at a second temperature higher than the first temperature to grow a GaN layer on the buffer layer.

According to still another aspect of the invention, there is provided a method for preparing an epitaxial wafer comprising the steps of:

supplying a first mixture of material gases comprising HCl and a second mixture of material gases comprising NH$_3$ into a chamber heated by a heat source disposed outside of the chamber;

forming gallium chloride (GaCl) by reacting metal Ga contained in a vessel in the chamber with HCl included in the first mixture of material gases;

growing a buffer layer by vapor deposition on a substrate at a first temperature disposed in the chamber;

improving crystallinity of the buffer layer by increasing substrate temperature from the first temperature; and supplying the first and second mixtures of material gases into the chamber in which the substrate is heated at a second temperature higher than the first temperature to grow a GaN layer on the buffer layer.

The first substrate temperature is preferably 400–600° C. and the second temperature is preferably 850–1000° C.

It is preferable that the step of improving crystallinity of the buffer layer by increasing substrate temperature from the first temperature is conducted with supplying $NH_3$ onto the substrate. The GaN layer is preferably grown at a growth rate of 4–10 μm/hour.

The first GaN layer of the epitaxial wafer according to the invention is crystallized by heating a GaN amorphous layer formed at a low temperature of 400–600° C. By this, the first GaN layer has a large amount of stacking faults and high impurity densities, such as chlorine, hydrogen, oxygen. This makes the first GaN layer distinguishable from an GaN epitaxial layer formed on it which will be explained hereinafter. The first GaN layer is formed to protect the semiconductor substrate in the succeeding film deposition process at a high temperature. For this purpose, the first GaN layer should be formed at a low temperature of 400–600° C., at which the semiconductor substrate is not damaged, and should have a thickness of 60 nanometers or more. According to the invention, a GaAs substrate can be used as a substrate of a GaN epitaxial layer, which is hard to be realized in prior art. It is preferable to supply $NH_3$ onto substrate while the first GaN layer is heated up. This prevents GaN from evaporating and subliming during the heating.

Since the first GaN layer is grown at a low temperature, it has a small growth rate. Therefore, it will spoil manufacturing efficiency if the first GaN layer is formed to have too large thickness. From this point of view, the first GaN layer should have a thickness of not more than 200 nanometers. The effect of protecting the semiconductor substrate will not so improved, if the first GaN layer has a thickness of more than 200 nanometers.

On the other hand, the epitaxial wafer according to the invention comprises a second GaN layer having a thickness of 0.1 μm or more and formed on the first GaN layer. The thickness of the second GaN layer is determined by properties of the light emitting device to be manufactured. However, a thickness of 0.1 μm is too small. The second GaN layer is an epitaxial layer and preferably has a thickness of not more than 5 μm. If the second GaN layer has a thickness of 5 μm, it will be cracked owing to stress. The second GaN layer is preferably grown at a temperature of 850–1000° C.

According to the invention, the second GaN layer is preferably grown at a growing rate of 4–10 μm/hour. If its growing rate is lower than 4 μm/hour, the semiconductor substrate may be deteriorated by heat so that the GaN epitaxial layer may peel. In case of the growing rate of higher than 10 μm/hour, the GaN epitaxial layer will have poor crystallinity so that the GaN may have insufficient electronic properties for a blue light emitting device.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Figure 5:
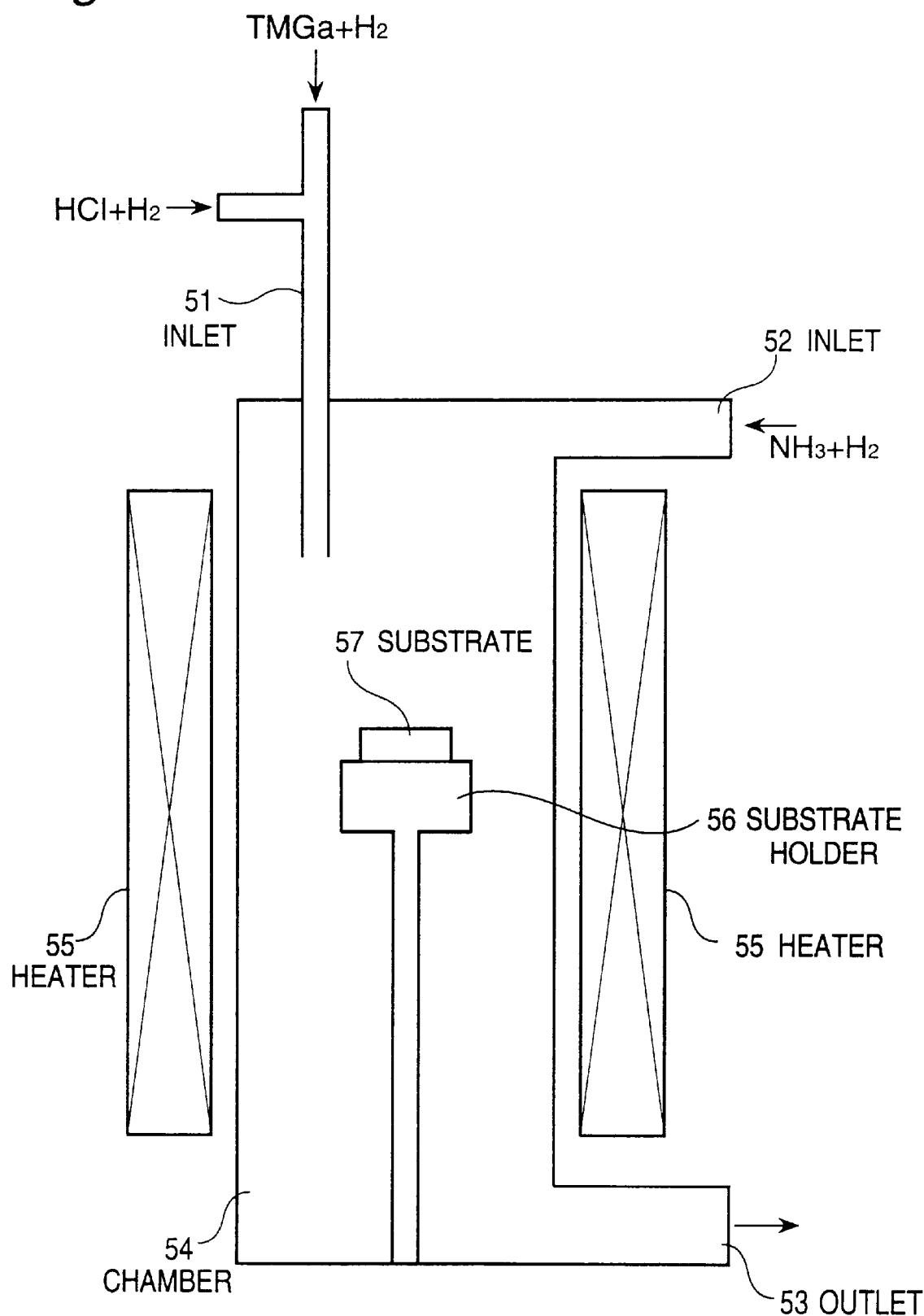
FIG. 5 is a schematic view of a vapor deposition apparatus used for preparing an epitaxial wafer according to the invention.

Referring to FIG. 5, there is shown a schematic view of a vapor deposition apparatus used for preparing an epitaxial wafer according to the invention. In FIG. 5, the apparatus comprises a quartz chamber 54 having a first inlet 51, a second inlet 52 and an outlet 53, and a electrical resistance heater 55 heating inside of the chamber 54 from its outside. A substrate holder 56 is disposed in the chamber 54 on which a substrate 57 is mounted.

By using the above apparatus, the epitaxial wafer according to the invention was prepared as follows:

first, a GaAs (111) A-plane substrate 57 was mounted on the substrate holder 56. Then, the chamber 54 was heated by the heater 55 so that the substrate 57 was heated to a temperature of 450° C. Trimethylgallium (TMG) was introduced under a partial pressure of $6.4\times10^{-4}$ atm and HCl was introduced under a partial pressure of $6.4\times10^{-4}$ atm from the first inlet 51 and $NH_3$ was introduced under a partial pressure of 0.11 atm with maintaining the substrate temperature of 450° C. $H_2$ gas was used for carrier gas. A GaN buffer layer having a thickness of 100 nanometers by 30 minutes deposition under the condition.

Then, the substrate temperature was increased to 900° C. under a partial pressure of $NH_3$ of 0.11 atm. Thereafter, deposition was conducted under a partial pressure of TMG of $2.4\times10^{-3}$ atm, a partial pressure of HCl of $2.4\times10^{-3}$ atm and a partial pressure of $NH_3$ of 0.11 atm for 30 minutes.

Figure 1:
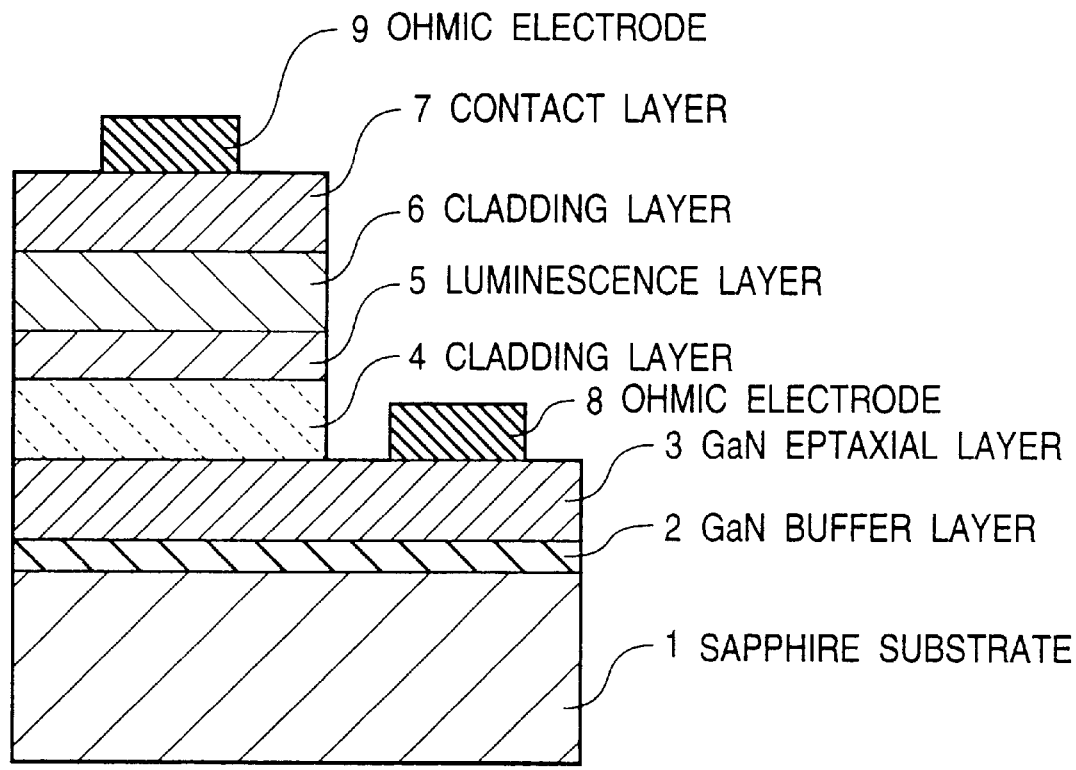
FIG. 1 shows a sectional view of a conventional GaN blue light emitting device, as already explained.
Figure 2:
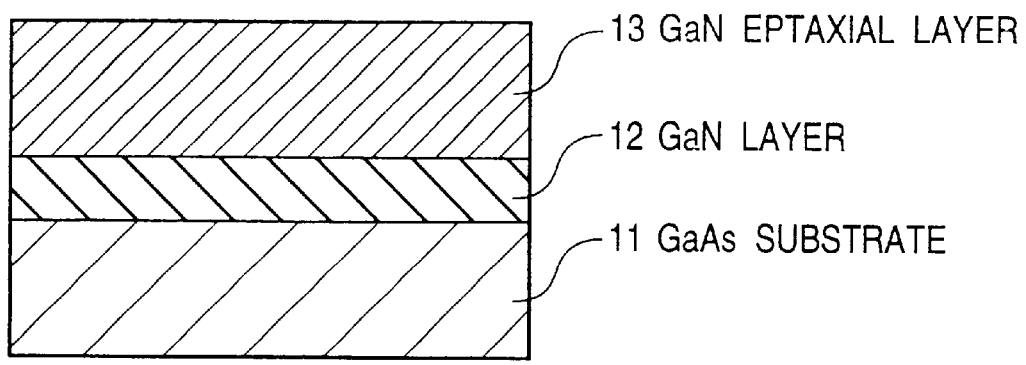
FIG. 2 is a sectional view of an embodiment of a epitaxial wafer according to the invention.

By this, a GaN epitaxial layer having a thickness of 3 μm and a glassy surface was obtained on the buffer layer. The growth rate was 6 μm/hour. The sectional view of the epitaxial wafer was schematically shown in FIG. 2. The epitaxial wafer had a first GaN layer 12 having a high impurity density on a GaAs(111) A-substrate 11 and a second GaN layer 13 stacked on the first GaN layer 12. Peaks of hexagonal GaN were observed by X-ray diffraction so that it was ascertained that the second GaN layer 13 was formed of hexagonal GaN. Electrical properties obtained by Hall measurement showed n-type carrier density of $1\times10^{17}$ $cm^{-3}$ and electron mobility of 500 $cm^2/V_s$.

Figure 3:
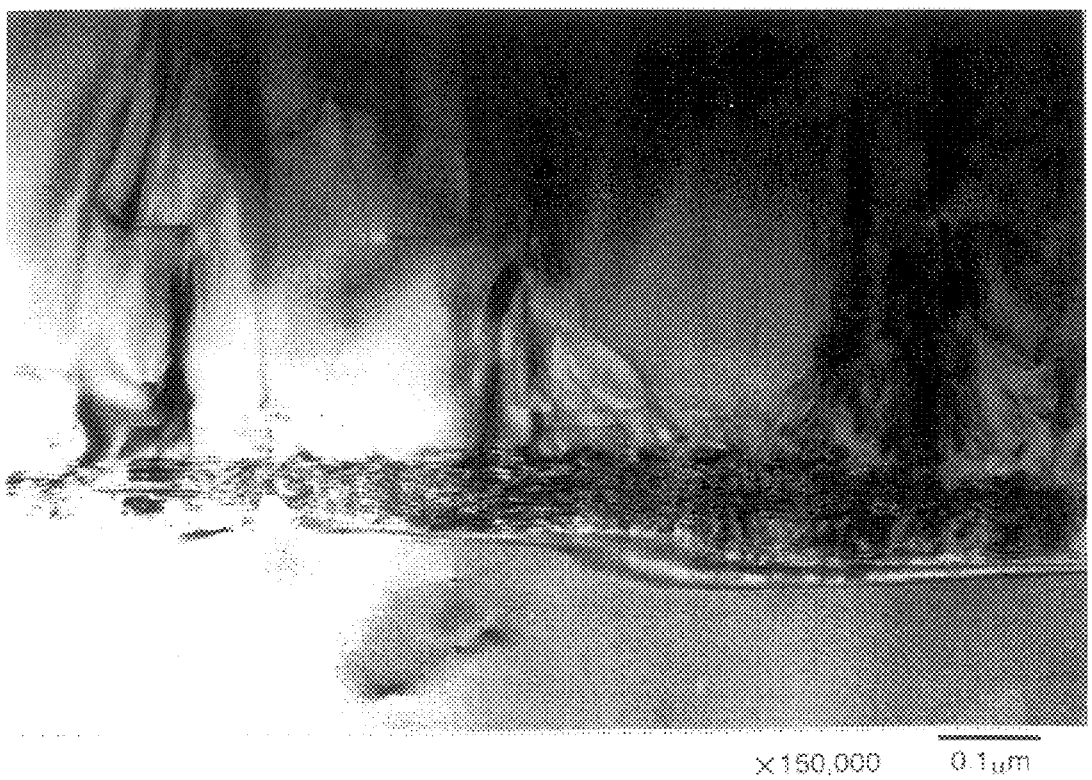
FIG. 3 shows a scanning electron microscopy photograph of a section of an embodiment of a epitaxial wafer in accordance with the present invention.

FIG. 3 shows a transmission electron microscopy photograph of the epitaxial wafer obtained by the above process according to the invention. In FIG. 3, a quarter part from the bottom in which there are many horizontal lines shows the buffer layer where the horizontal lines show stacking faults. As shown in FIG. 3, the buffer layer has a large amount of stacking faults after the epitaxial layer is completed, which makes the buffer layer distinguishable.

Figure 4:
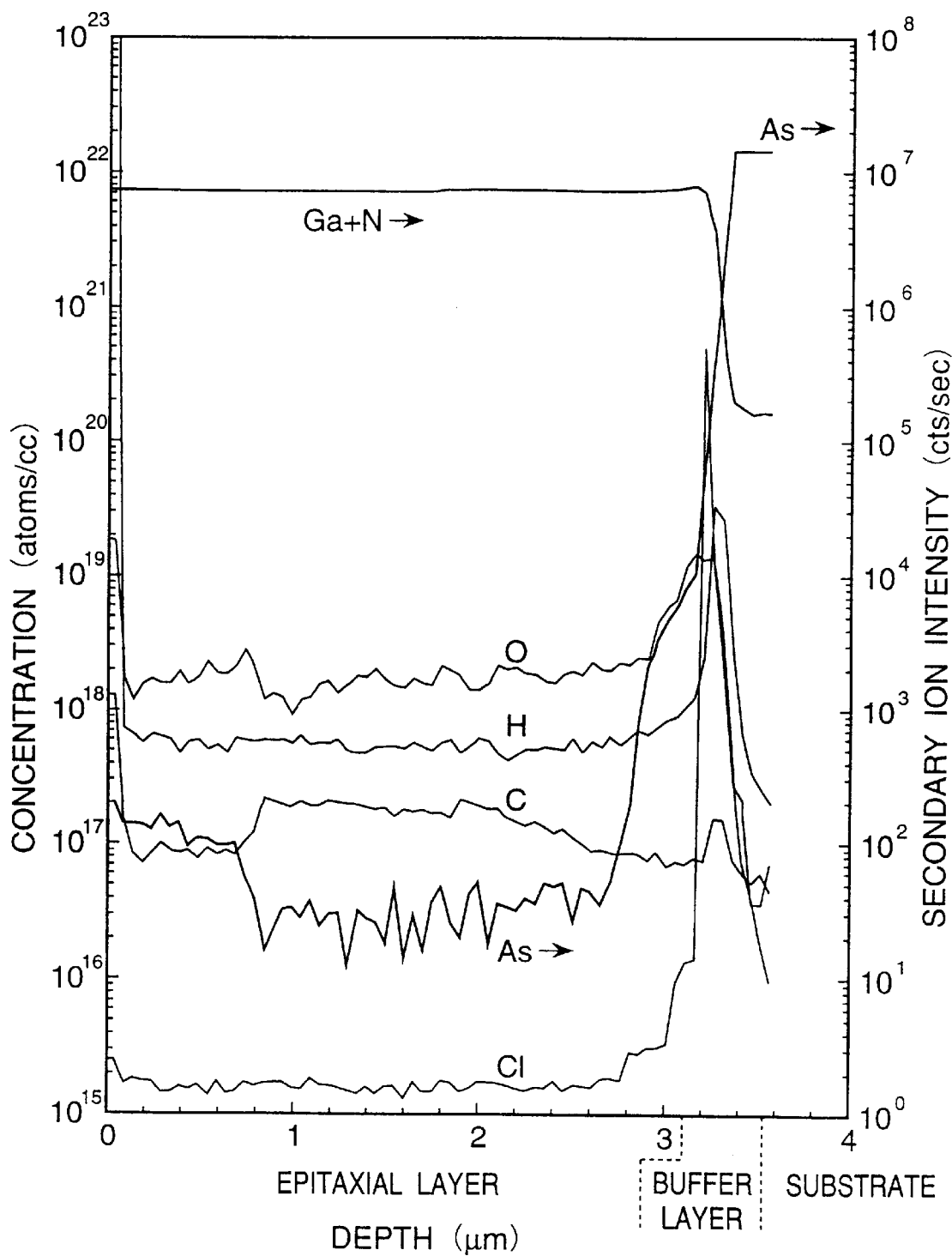
FIG. 4 is a graph illustrating a result of the secondary ion mass spectrometry of an embodiment of a epitaxial wafer in accordance with the present invention.

FIG. 4 shows a graph illustrating a result of the secondary ion mass spectrometry (SIMS) of the above epitaxial wafer in accordance with the present invention. As shown in FIG. 4, density of impurities, such as hydrogen, oxygen, chlorine are higher in the buffer layer of the epitaxial wafer according to the invention, because the buffer layer was grown at a low temperature. The impurity densities of chlorine may reach $5\times10^{21}cm^3$, of hydrogen $4\times10^{19}/cm^3$ and of oxygen $5\times10^{19}/$ cm$^3$. In the above embodiment, a GaAs (111) A-plane substrate was used. However, in case of a GaAs (111) B-plane substrate, an epitaxial wafer having almost same properties was obtained although films were prone to be stripped.

Embodiment 2

Figure 6:
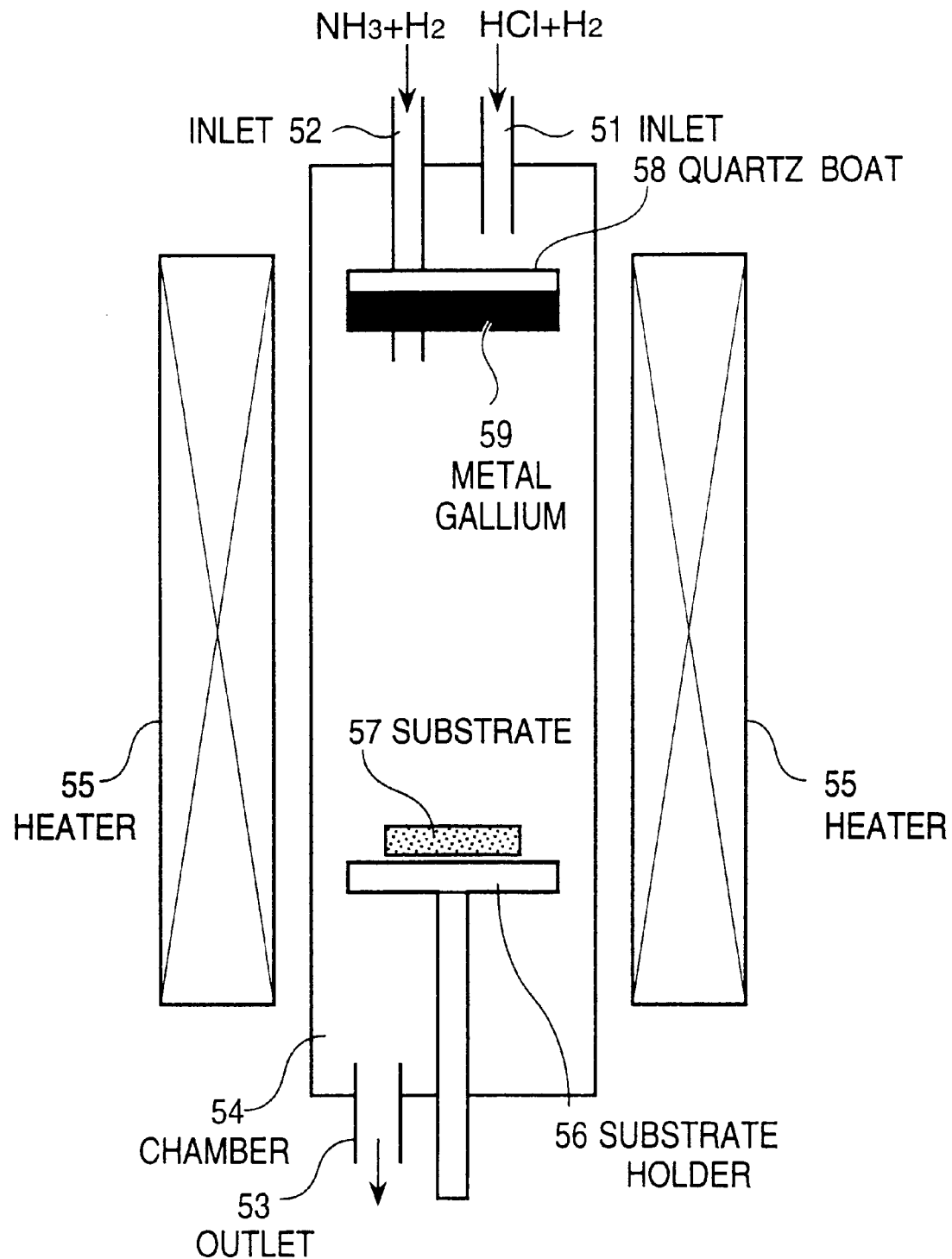
FIG. 6 is a schematic view of a hydride vapor phase epitaxy apparatus used for preparing an epitaxial wafer according to the invention.

Referring to FIG. 6, there is shown a schematic view of a hydride vapor phase epitaxy apparatus used for preparing an epitaxial wafer according to the invention. In FIG. 6, the apparatus comprises a quartz chamber 54 having a first inlet 51, a second inlet 52 and an outlet 53, and a electrical resistance heater 55 heating inside of the chamber 54 from its outside. A quartz boat 58 containing metal gallium 59 in it is arranged at a top of inside of the chamber 54 into which the mixture introduced from the first inlet 51 is blown. Additionally, a substrate holder 56 is disposed in the chamber 54 on which a substrate 57 is mounted.

By using the above apparatus, the epitaxial wafer according to the invention was prepared as follows:

At first, metal gallium 59 was contained in the quartz boat 58, and a GaAs (111) A-plane substrate 57 was mounted on the substrate holder 56. Then, the chamber 54 was heated by the heater 55 so that the metal gallium was heated to a temperature of 800° C. or higher and the substrate 57 was heated to a temperature of 500° C. HCl was introduced under a partial pressure of $6.4 \times 10^{-4}$ atm from the first inlet 51 and NH$_3$ was introduced under a partial pressure of 0.11 atm with maintaining the gallium temperature of 800° C. and the substrate temperature of 500° C. H$_2$ gas was used for carrier gas. The HCl gas was blown into the quartz boat 58 so as to generate GaCl by reacting with the metal gallium and the GaCl was flown to downstream of the chamber 54. Deposition was conducted under this condition when a GaN buffer layer was grown at a thickness of 90 nanometers, the HCl gas was shut to stop deposition.

Then, the substrate temperature was increased to 980° C. under a partial pressure of NH$_3$ of 0.11 atm. Thereafter, deposition was again begun by supplying HCl under a partial pressure of $2.4 \times 10^{-3}$ atm and a partial pressure of NH$_3$ of 0.11 atm. It is possible to deposit GaN epitaxial layer at a substrate temperature of around 1030° C. However, in this case, the GaAs substrate will react with NH$_3$ gas so as to be damaged severely. Therefore, the substrate temperature is preferably 1000° C. or lower.

When the GaN epitaxial layer was grown to have a thickness of 4 μm the HCl gas was shut to stop the deposition. The substrate was cooled while the NH$_3$ gas was flowing. By this a GaN epitaxial layer having a thickness of 4 μm and a glassy surface was obtained on the buffer layer. According to the SIMS, impurity density of carbon was lower than detection critical. Electrical properties obtained by Hall measurement showed n-type carrier density of $1 \times 10^{18}$ cm$^{-3}$, electron mobility of 250 cm$^2$/V$_s$ and X-ray half width was around 5.2 minutes.

Comparison 1

Effect of difference of the thickness of the buffer layer was investigated. A buffer layer having a thickness of 30 nanometers was deposited on a GaAs (111) A-plane substrate and a GaN epitaxial layer was deposited on the buffer layer. The condition other than the thickness of the buffer layer was same as Embodiment 1. The GaN epitaxial layer deposited the buffer layer on the GaAs substrate was completely stripped.

Comparison 2

Effect of difference of the deposition rate of the GaN epitaxial layer was investigated. A GaN epitaxial layer was deposited at a deposition rate of 3 μm/hour. A partial pressure of TMG was $4.8 \times 10^{-4}$ atm, a partial pressure of HCl was $4.8 \times 10^{-4}$ atn and a partial pressure of NH$_3$ was 0.11 atm. The other condition was same as Embodiment 1. The GaN epitaxial layer deposited the buffer layer on the GaAs substrate was completely stripped.

Comparison 3

Effect of difference of the substrate temperature at which the GaN epitaxial layer was grown was investigated. A GaN epitaxial layer was deposited at a substrate temperature of 800° C. The other condition was same as Embodiment 1. Peaks of hexagonal GaN were observed by X-ray diffraction so that it was ascertained that the second GaN layer 13 was formed of hexagonal GaN. Electrical properties obtained by Hall measurement showed n-type carrier density of $1 \times 10^{19}$ cm$^{-3}$ and electron mobility of 100 cm$^2$/V$_s$.

The invention has thus been shown and described with reference to the specific embodiments. However, it should be noted that the present invention is in no way limited to the details of the illustrated structures but changes and modifications may be made within the scope of the appended claims.

The entire disclosure of Japanese Patent Application No. 9-82319 filed on Mar. 14, 1997 and Japanese Patent Application filed on Mar. 11, 1998 under reference number of 981A0028 of which application number is unknown including specifications, claims, drawings and summaries are incorporated herein by reference in their entireties.

What is claimed is:

1. A method for preparing an epitaxial layer onto GaAs substrate comprising the steps of:

supplying a first mixture of material gases comprising a metallorganic including Ga and HCl and a second mixture of material gases comprising NH$_3$ into a chamber heated by a heat source disposed outside of said chamber;

growing a buffer layer having a thickness in the range of 60 nanometers to 200 nanometers by vapor deposition on a GaAs substrate at a first temperature of 400–600° C. disposed in the chamber;

improving crystallinity of the buffer layer by increasing substrate temperature from the first temperature; and supplying said first and second mixture of material gases into said chamber in which the substrate is heated at a second temperature higher than said first temperature to grow a GaN layer on said buffer layer.

2. A method claimed in claim 1; wherein said second temperature is 850–1000° C.

3. A method claimed in claim 1; wherein said step of improving crystallinity of the buffer layer by increasing substrate temperature from the first temperature is conducted with supplying NH$_3$ onto the substrate.

4. A method claimed in claim 1; wherein said GaN layer is grown at a growth rate of 4–10 μm/hour.

5. A method for preparing an epitaxial layer onto GaAs substrate comprising the steps of:

supplying a first mixture of material gases comprising HCl and a second mixture of material gases comprising NH$_3$ into a chamber heated by a heat source disposed outside of said chamber;

forming GaCl by reacting metal Ga contained in a vessel in said chamber with HCl included in said first mixture of material gases;

growing a buffer having a thickness in the range of 60 nanometers to 200 nanometers by vapor deposition on a GaAs substrate at a first temperature of 400–600° C. disposed in the chamber;

improving crystallinity of the buffer layer by increasing substrate temperature from the first temperature; and supplying said first and second mixtures of material gases into said chamber in which the substrate is heated at a second temperature higher than said first temperature to grow a GaN layer on said buffer layer.

6. A method claimed in claim 5; wherein said second temperature is 850–1000° C.

7. A method claimed in claim 5; wherein said step of improving crystallinity of the buffer layer by increasing substrate temperature from the first temperature is conducted with supplying $NH_3$ onto the substrate.

8. A method claimed in claim 5; wherein said GaN layer is grown at a growth rate of 4–10 $\mu$m/hour.

9. A method for preparing an epitaxial wafer comprising the steps of:

supplying a first mixture of material gases comprising a metallorganic including Ga and HCl and a second mixture of material gases comprising $NH_3$ into a chamber heated by a heat source disposed outside of said chamber;

growing a buffer layer having a thickness in the range of 60 nanometers to 200 nanometers by vapor deposition on a GaAs substrate at a first temperature of 400–600° C. disposed in the chamber;

improving crystallinity of the buffer layer by increasing substrate temperature from the first temperature; and supplying said first and second mixture of material gases into said chamber in which the substrate is heated at a second temperature higher than said first temperature to grow a GaN layer on said buffer layer.

10. A method for preparing an epitaxial wafer comprising the steps of:

supplying a first mixture of material gases comprising HCl and a second mixture of material gases comprising $NH_3$ into a chamber heated by a heat source disposed outside of said chamber;

forming GaCl by reacting metal Ga contained in a vessel in said chamber with HCl included in said first mixture of material gases;

growing a buffer having a thickness in the range of 60 nanometers to 200 nanometers by vapor deposition on a GaAs substrate at a first temperature of 400–600° C. disposed in the chamber, improving crystallinity of the buffer layer by increasing substrate temperature from the first temperature; and supplying said first and second mixtures of material gases into said chamber in which the substrate is heated at a second temperature higher than said first temperature to grow a GaN layer on said buffer layer.

11. A method for preparing an epitaxial layer onto GaAs substance comprising the steps of:

supplying a first mixture of material gases comprising a metallorganic including Ga and HCl and a second mixture of material gases comprising $NH_3$ into a chamber heated by a heat source disposed outside of said chamber;

growing a first GaN layer having a thickness in the range of 60 nanometers to 200 nanometers by vapor deposition on a GaAs substrate at a first temperature of 400–600° C. disposed in the chamber;

growing a second GaN layer having a thickness in the range of 0.1 micrometers or more having improved crystallinity of the buffer layer due to increasing substrate temperature from the first temperature, and supplying said first and second mixture of material gases into said chamber in which the substrate is heated at a second temperature higher than said first temperature to grow said first and second GaN layers on said buffer layer.

* * * * *